US006495070B1

United States Patent
Cole et al.

(10) Patent No.: US 6,495,070 B1
(45) Date of Patent: Dec. 17, 2002

(54) FLEXIBLE HIGH PERFORMANCE MICROBOLOMETER DETECTOR MATERIAL FABRICATED VIA CONTROLLED ION BEAM SPUTTER DEPOSITION PROCESS

(75) Inventors: Barrett E. Cole, Bloomington, MN (US); Christopher J. Zins, Inver Grove Heights, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/222,649

(22) Filed: Dec. 30, 1998

Related U.S. Application Data

(62) Division of application No. 08/770,894, filed on Dec. 31, 1996, now Pat. No. 6,322,670.

(51) Int. Cl.[7] .................................................. H01B 1/08
(52) U.S. Cl. .................................................. 252/520.4
(58) Field of Search ........................... 252/518.1, 519.1, 252/520.4; 423/62, 592

(56) References Cited

U.S. PATENT DOCUMENTS

| | | | |
|---|---|---|---|
| 3,932,312 A | * 1/1976 | Kazmierowicz | ............ 252/578 |
| 4,166,784 A | 9/1979 | Chapin et al. | |
| 4,592,304 A | 6/1986 | Hager et al. | |

(List continued on next page.)

OTHER PUBLICATIONS

T. Stapinski et al., "Evaporated VOX Thin Films", Physics and Electron Technology Dept., Academy of Mining and Metallurgy al.Mickiewicaz 30, 30059 Cracow, Poland, SPIE vol. 1016 Optical Materials Technology for Energy Efficiency and Solar Energy Conversion VII, pp. 162–169 (1988).

G.J. Hyland "Semiconductor—Metal Phase Transitions", School of Physics, University of Warwick, Coventry, England, Journal of Solid State Chemistry 2, 318–331 (1970).

H. Jerominek et al., "Vanadium Oxide Films for Optical Switching and Detection" *Optical Engineering*, 32, 9, pp. 2092–2099 (1993).

Cevro et al., "Ion beam sputtering and dual ion beam sputtering of titanium oxide films," *Journal of Physics D: Applied Physics*, Sep. 14, 1995; vol. 28(9):1962–1976.

Chain, "Effects of oxygen in ion–beam sputter deposition of vanadium oxide," *Journal of Vacuum Science & Technology*, 1987; vol. 5(4):1836–1839.

Yong–Su Oh et al., "Preparation of Vanadium Oxide Thin Films by Radio–Frequency Magnetron Sputtering," *Journal of the Ceramic Society of Japan*, Dec. 1992; vol. 100(12):1371–1373.

Yoshitake et al., "The use of the ion beam current as a process control in the reactive sputtering of zirconium oxide," *Thin Solid Films*, Jul. 15, 1993; vol. 230(1):48–54.

*Primary Examiner*—Mark Kopec
(74) *Attorney, Agent, or Firm*—Kris T. Fredrick

(57) ABSTRACT

A microbolometer film material VOx having a value such that the thermal coefficient of resistance is between 0.005 and 0.05. The film material may be formed on a wafer. The VOx material properties can be changed or modified by controlling certain parameters in the ion beat sputter deposition environment. There is sufficient control of the oxidation process to permit non-stoichometric formation of VOx films. The process is a low temperature process (less than 100 degrees C.). Argon is used for sputtering a target of vanadium in an environment wherein the oxygen level is controlled to determine the x of VOx. The thickness of the film is controlled by the time of the deposition. Other layers may be deposited as needed to form pixels for a bolometer array.

7 Claims, 6 Drawing Sheets

U.S. PATENT DOCUMENTS

| | | |
|---|---|---|
| 4,614,957 A | 9/1986 | Arch et al. |
| 4,654,622 A | 3/1987 | Foss et al. |
| 4,752,694 A | 6/1988 | Hegel, Jr. et al. |
| 5,129,595 A | 7/1992 | Thiede et al. |
| 5,171,733 A | 12/1992 | Hu |
| 5,286,976 A | 2/1994 | Cole |
| 5,367,167 A | 11/1994 | Keenan |
| 5,399,897 A | 3/1995 | Cunningham et al. |
| 5,420,419 A | 5/1995 | Wood |
| 5,450,053 A | 9/1995 | Wood |
| 5,602,393 A | 2/1997 | Gerard |
| 5,627,112 A | 5/1997 | Tennant et al. |
| 5,675,149 A | 10/1997 | Wood et al. |
| 5,701,008 A | 12/1997 | Ray et al. |
| 5,721,431 A | 2/1998 | Hersom et al. |
| 5,729,016 A | 3/1998 | Klapper et al. |
| 5,753,885 A | 5/1998 | Iwasa et al. |
| 5,756,999 A | 5/1998 | Parrish et al. |
| 5,763,882 A | 6/1998 | Klapper et al. |
| 5,763,885 A | 6/1998 | Murphy et al. |
| 5,801,383 A * | 9/1998 | Wada et al. ................ 250/332 |
| 5,852,308 A | 12/1998 | Wood |
| 5,861,545 A | 1/1999 | Wood |
| 5,892,140 A | 4/1999 | Wood |
| 5,895,233 A | 4/1999 | Higashi et al. |
| 5,933,245 A | 8/1999 | Wood et al. |
| RE36,615 E | 3/2000 | Wood |
| 6,036,872 A | 3/2000 | Wood et al. |
| 6,121,618 A | 9/2000 | Morris |
| 6,313,463 B1 * | 11/2001 | Cole et al. ................ 250/338.4 |
| 6,322,670 B2 | 11/2001 | Cole et al. |
| 2001/0035341 A1 | 11/2001 | Cole et al. |

* cited by examiner

FLEXIBLE HIGH PERFORMANCE MICROBOLOMETER DETECTOR MATERIAL FABRICATED VIA CONTROLLED ION BEAM SPUTTER DEPOSITION PROCESS

This is a divisional of application Ser. No. 08/770,894, filed Dec. 31, 1996, now U.S. Pat. No. 6,322,670 which is incorporated herein by reference.

BACKGROUND OF THE INVENTION

The present invention pertains to microbolometer sensors and particularly to detector material for microbolometers. More particularly, the invention pertains to a particular detector material which is fabrication from a special ion beam sputter deposition process. The U.S. Government has certain rights in the present invention.

A major factor in the sensitivity of a bolometer is the TCR (thermal coefficient of resistance) of the detector material. The overall NETD sensitivity of the bolometer also depends on the noise level. Previous bolometer materials are typically high TCR metals with a TCR in the range from 0.003 to 0.004. These materials have low noise but also have low TCR. Since the metals are reflectors, they also degrade the absorbance properties of the detector. Materials which undergo a phase transitions (i.e., Mott transition) can have a very high TCR's in the transition region but can suffer from a number of problems. First, the latent heat accompanying the phase change for these materials may significantly decrease the sensitivity of the detector. Second, most switching material can be produced in only one form without additional doping, which defines the material resistance and TCR. Further, the temperature range over which the transition occurs is typically very small requiring tight temperature control of the operation. Finally, the films must be produced in crystalline form which requires high temperature depositions.

SUMMARY OF THE INVENTION

The present invention is peculiar vanadium oxide (VOx/ABx) (i.e., $VO_x/AB_x$) detector material and process that is used to make that material. The x of VOx is a value fitting for the pixel being sputter deposited by the present process and is not necessarily a specific digit such as "2", but may be between 1 and 2.5. That material is deposited as part of a pixel for a high performance microbolometer. The material is deposited by an ion beam sputtering with control of the deposition process leading to a flexible detector process for microbolometer detectors. These detector materials have optical, electrical, and thermal properties compatible with high performance detectors but which can be readily modified to suit individual requirements of an array design.

DESCRIPTION OF THE PREFERRED EMBODIMENT

Figure 1:
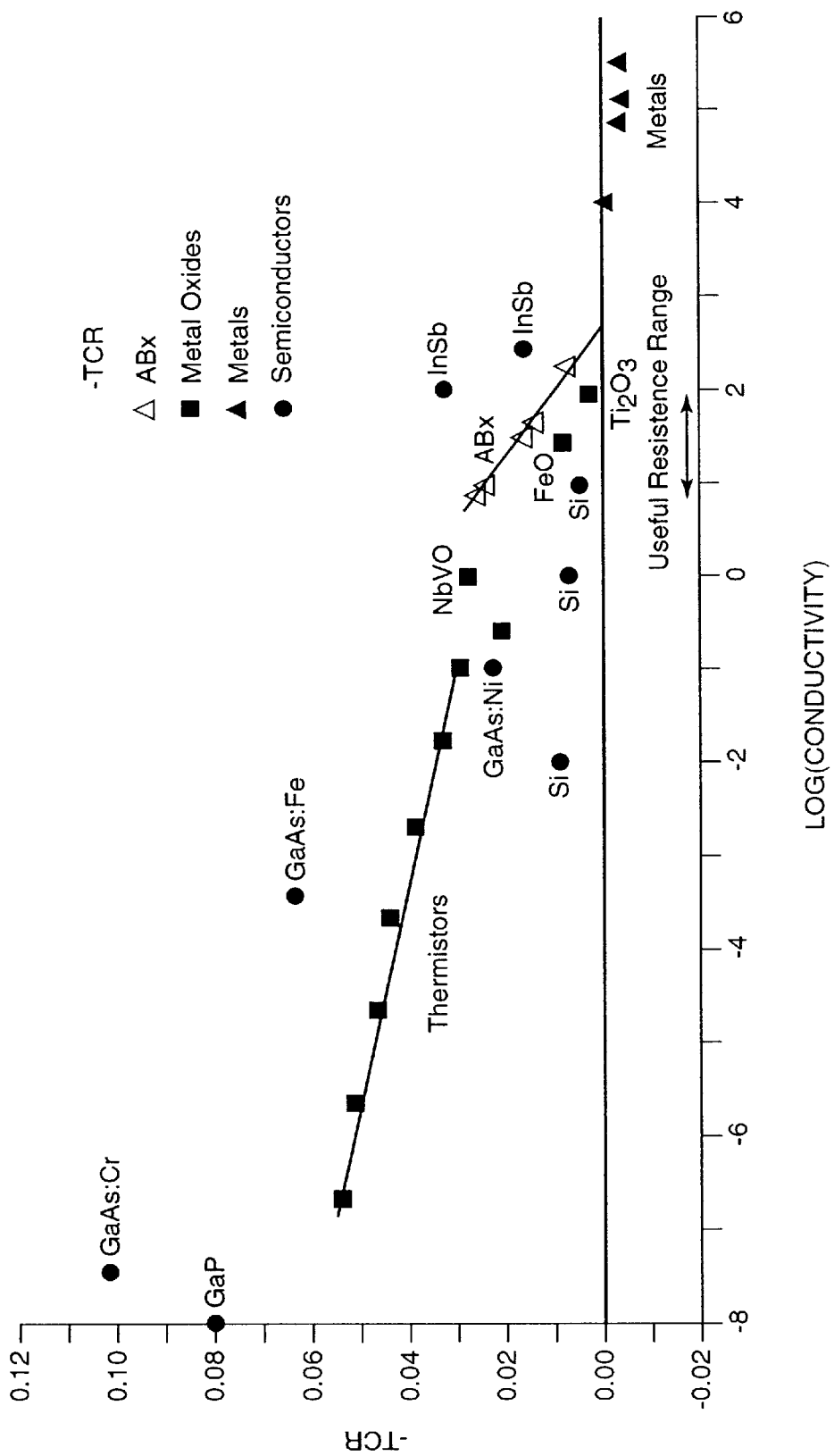
FIG. 1 reveals a TCR comparison of various materials, including VOx (ABx).
Figure 2:
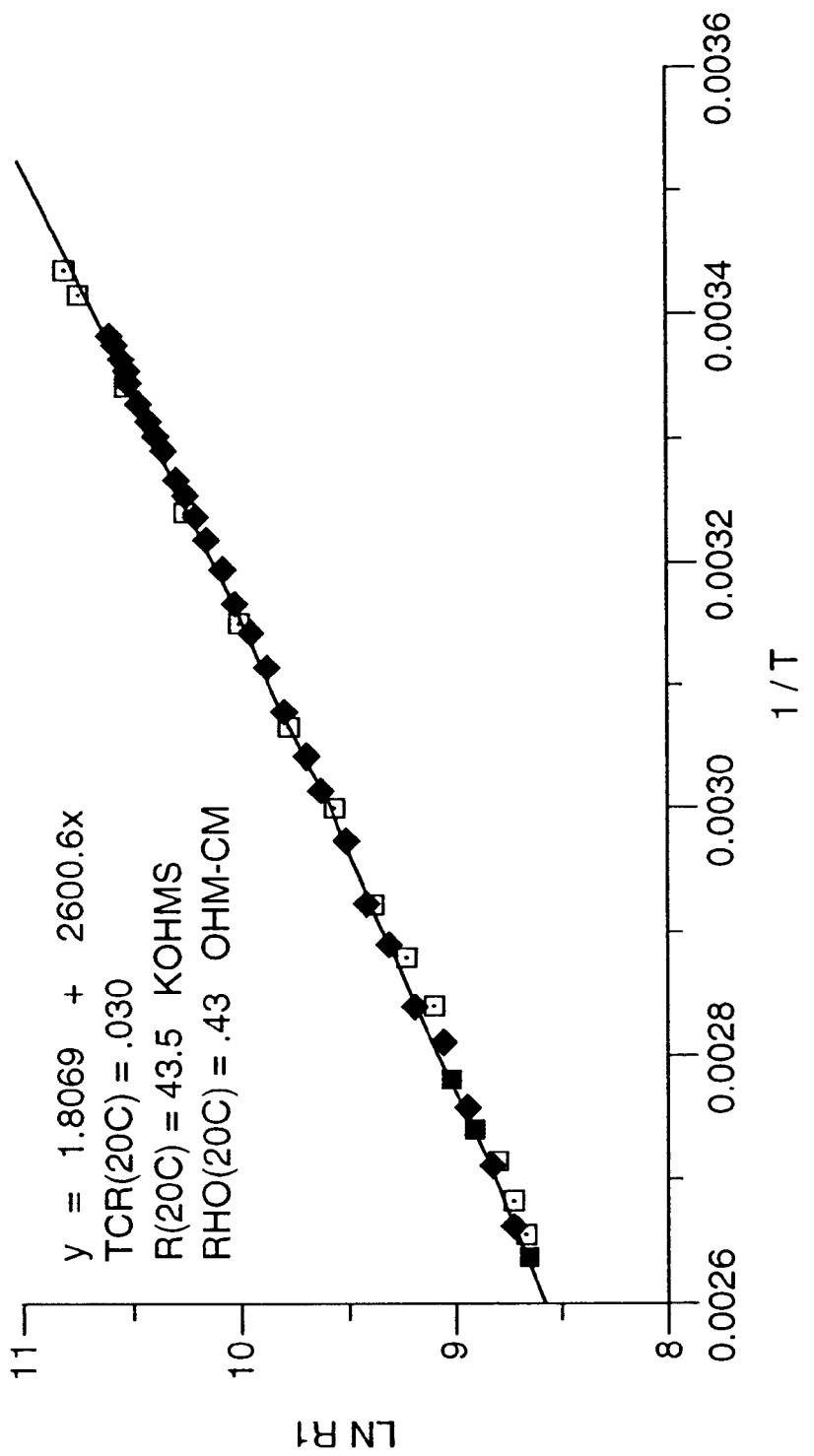
FIG. 2 is a graph showing electrical characteristics of a high TCR VOx detector film.

VOx deposited by a controlled ion beam sputtering process has produced bolometer detector films with a wide range of performance properties which has led to a flexible detector manufacturing process. Some of the advantages of the present detector film materials of the invention, which is the class of these materials and the processing used to make these materials, are noted. Bolometer film materials with high TCR's ranging from 0.005 to >0.03, such as 0.05, have been demonstrated. For a given resistivity, these materials are higher performing in microbolometers than any known material except for a few crystalline materials (which have not been produced on pixels), as shown in FIG. 1. FIG. 1 is a graph showing a comparison of the TCR versus conductivity of various materials relative to ABx (e.g., VOx). This class of materials has a well behaved relationship between resistance and TCR given by the relationship TCR=A+B*log(rho) (where "rho" is the film resistivity) which, for example, may be TCR=0.03+0.01*log(rho). A wide range of pixel resistance and TCR properties are possible by using different resistivity materials (obtained by slight modifications to the deposition process) combined with different detector patterns and thicknesses. These electrical properties for any particular VOx film are well behaved and characterized over a wide range of temperatures and are not limited to a narrow transition region, as indicated by FIG. 2. For any particular VOx film, resistance is given by LnR=A+(B/T) and the TCR which is defined as $$\frac{1}{R}\frac{dR}{dT}$$

is therefore $TCR=B/T^2$. FIG. 2 exhibits the electrical characteristics of a high TCR VOx detector film. These characteristics reveal a material having a well-behaved operation over a wide temperature range. Resistance levels are in the proper range to permit high current bolometer operation for optimal responsivity. The films are amorphous and exhibit no latent heat effects unlike the phase transition effects in VO2. The films are stable after annealing if not taken to a higher temperature. The resistance change on annealing is well-defined and can be corrected for by changes to the initial deposition conditions. 1/f noise levels are defined by $$V_{noise} = V_{bias}\sqrt{\frac{k}{f}}.$$

k values as low as $10^{-12}$ to $10^{-14}$ make 1/f noise contributions to total noise very small. Noise levels are close to Johnson noise limited values.

Figure 3:
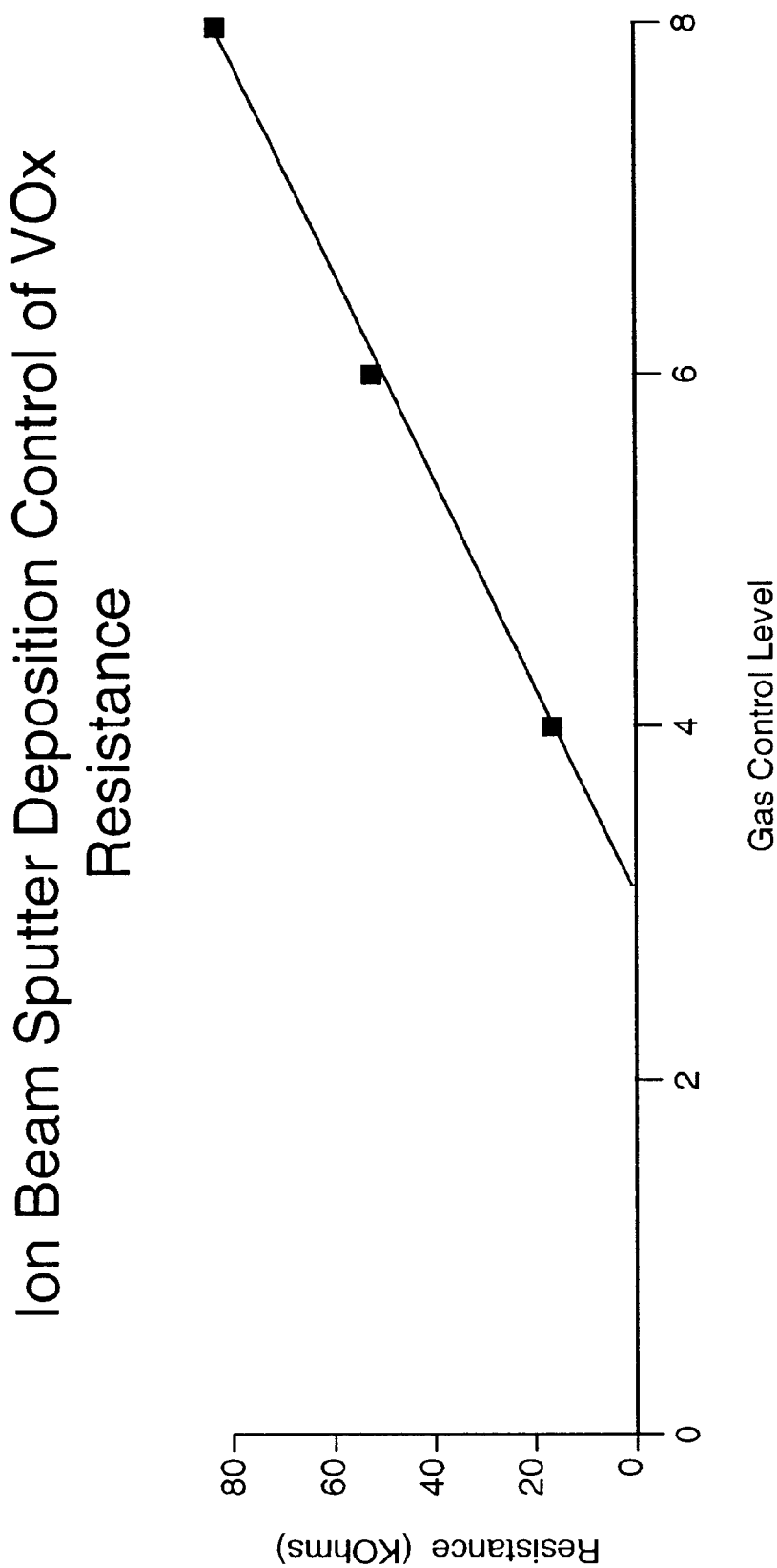
FIG. 3 exhibits determination of Vox resistance by control of the deposition environment.

The optical properties of VOX are compatible with high absorbance in the detector. The thermal mass of VOx, the thermal property of importance, is comparable to the major pixel material, Si3N4 (i.e., $Si_3N_4$). These VOx films have a high TCR over a range of thicknesses from as low as a few hundred Angstroms to as thick as 1500 Angstroms. This material of the films is compatible with microbolometer properties. The Vox material properties can readily be modified by a simple change in the ion beam sputter deposition environment of the process of the present invention, as revealed by FIG. 3. FIG. 3 is a graph that shows determination of Vox resistance by control of the ion beam sputter deposition environment such as the gas control level. The present ion beam sputtering provides sufficient control of the oxidation process to permit non-stoichiometric formation of Vox films. In other reactive deposition techniques, the oxidation process tends to proceed to completion forming only stoichiometric material. The ion beam sputter deposition is a lower temperature deposition process. This means that added flexibility in the patterning of VOx films can be achieved via liftoff processing which entails the use of photoresist during deposition.

Figures 4A, 4B:
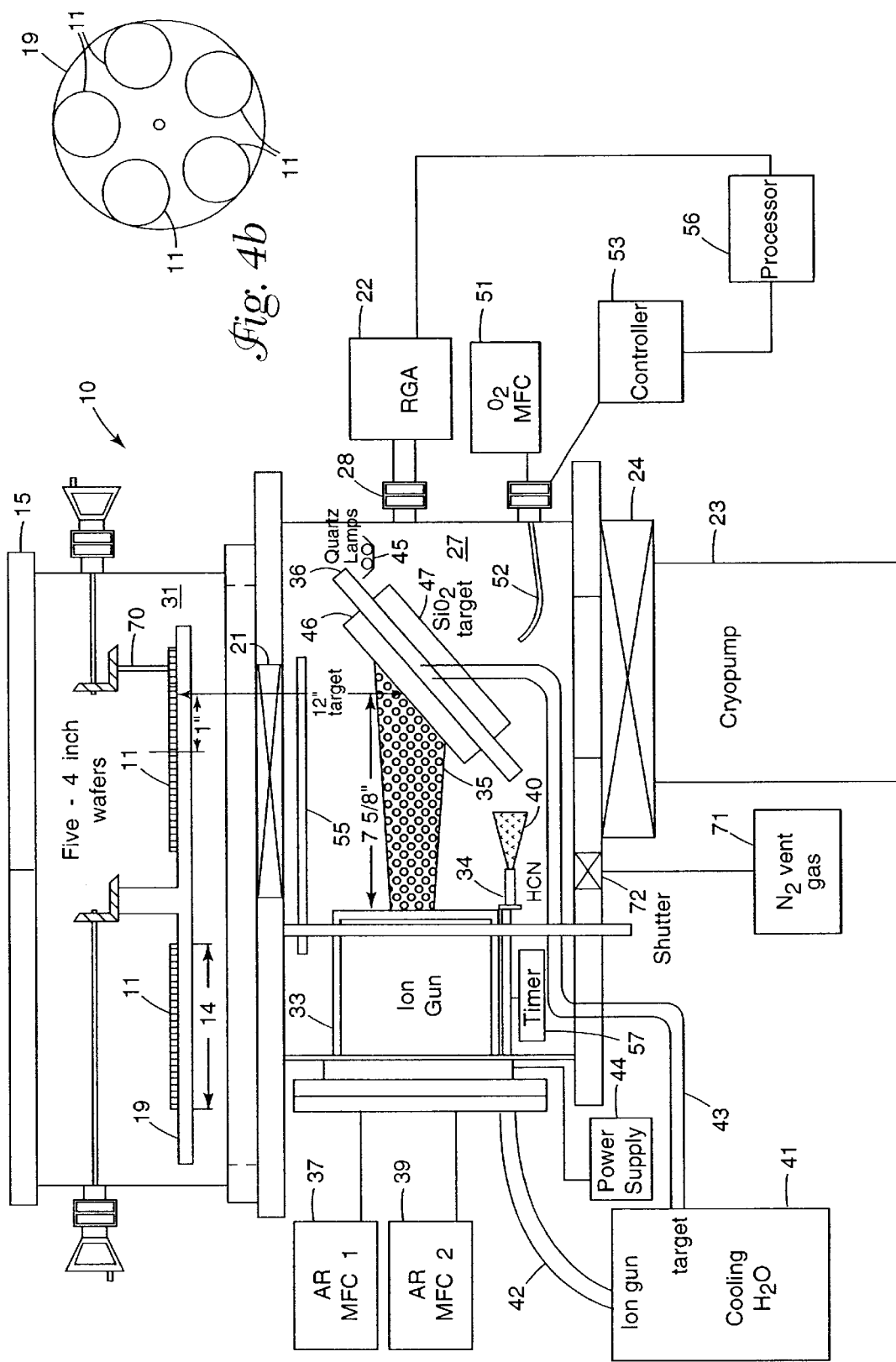
FIGS. 4a and 4b are a schematic of the deposition system.
Figure 5:
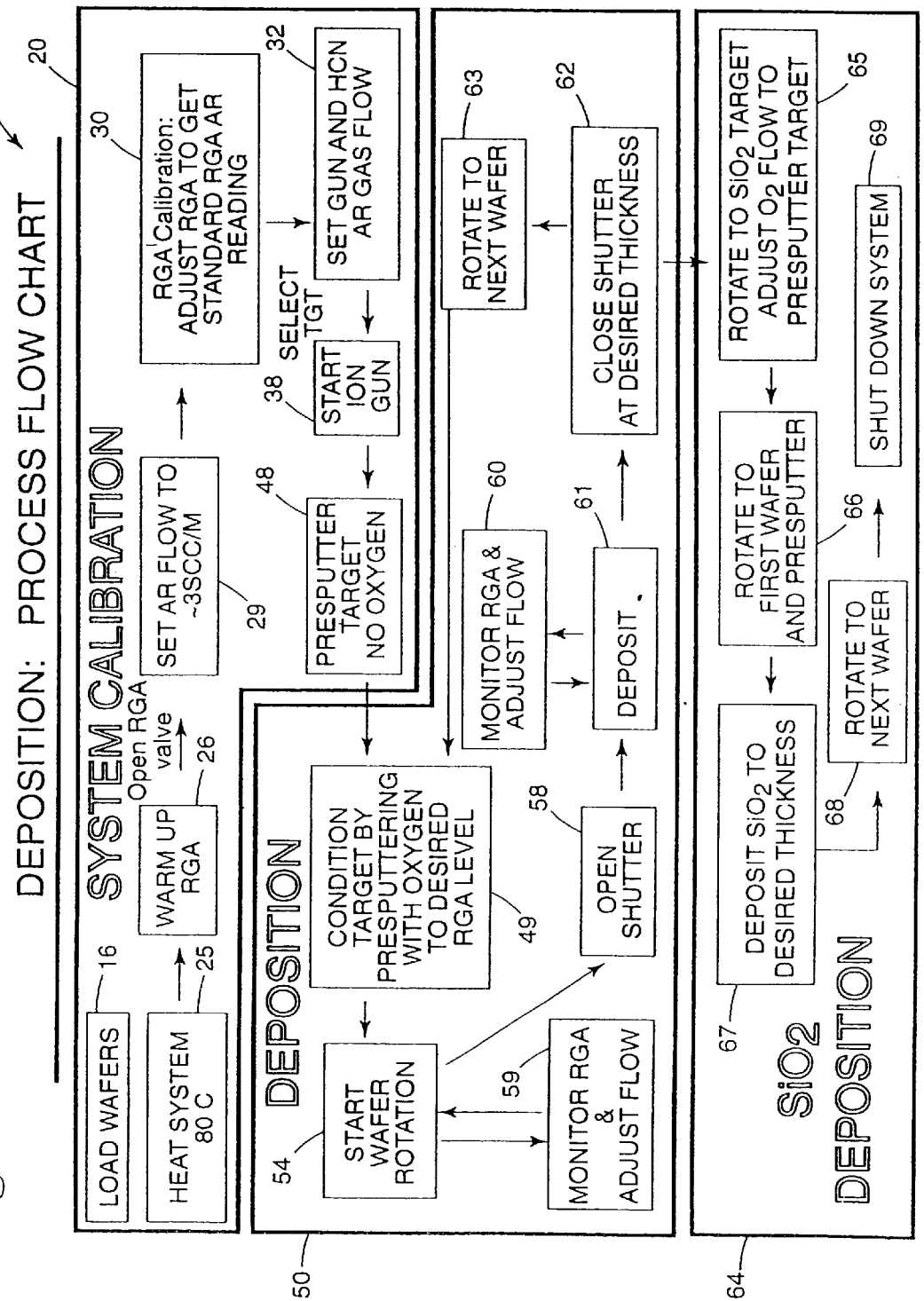
FIG. 5 is a schematic of the deposition process flow.

The method of the present invention is a process 18 of FIG. 5, performed in conjunction with deposition system 10 of FIG. 4a, which is capable of making the above-noted VOx material. Circular silicon wafers 11 with substrates containing electronic circuits and pixel lower layers 12 (see FIG. 6a) which are coated with an approximately 5000 Angstrom Si3N4 layer 13, are loaded into a five-wafer carousel 19 (of FIGS. 4a and 4b) through port 15 of deposition apparatus 10. Also, photoresist 74 (see FIG. 6a) may be on wafer 11 which defines pixels. At present, each wafer 11 has a diameter 14 of four inches. Wafer 11 loading is step 16 of process 18 flowchart. System 10 is first calibrated according to calibration step 20 of process 18, which involves pumping the system down to $2 \times 10^{-7}$ Torr pressure. The vacuum system is capable of pumping to base pressure less than $1 \times 10^{-7}$ Torr, with throughput to an eight inch two-stage cryopump 23 via valve 24. System 10 is pumped down by opening valve 21 which is left open during the process. System 10 may be warmed up at step 25 with lamps 45. A residual gas analyzer (RGA) 22 is warmed up at step 26 before the process calibration. RGA 22 is connected to chamber 27 and has a quadrupole probe which has an electron multiplier (EM) detector in a turbo-pumped sampling manifold to allow for operation in the $10^{-7}$ Torr pressure environment. RGA 22 may be connected to either upper chamber 31 or lower chamber 27. RGA 22 has an analog output.

Figure 6A:
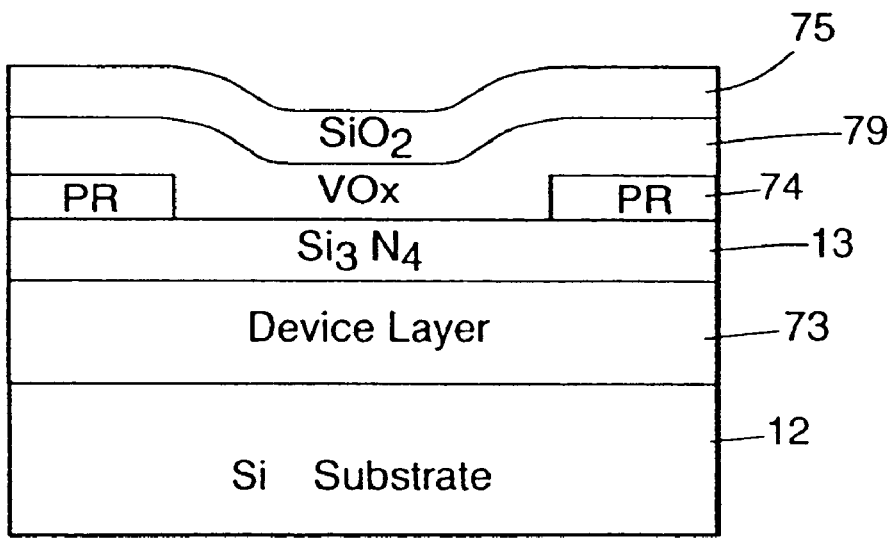
FIGS. 6a and 6b show several stages of the deposited wafer.
Figure 6B:
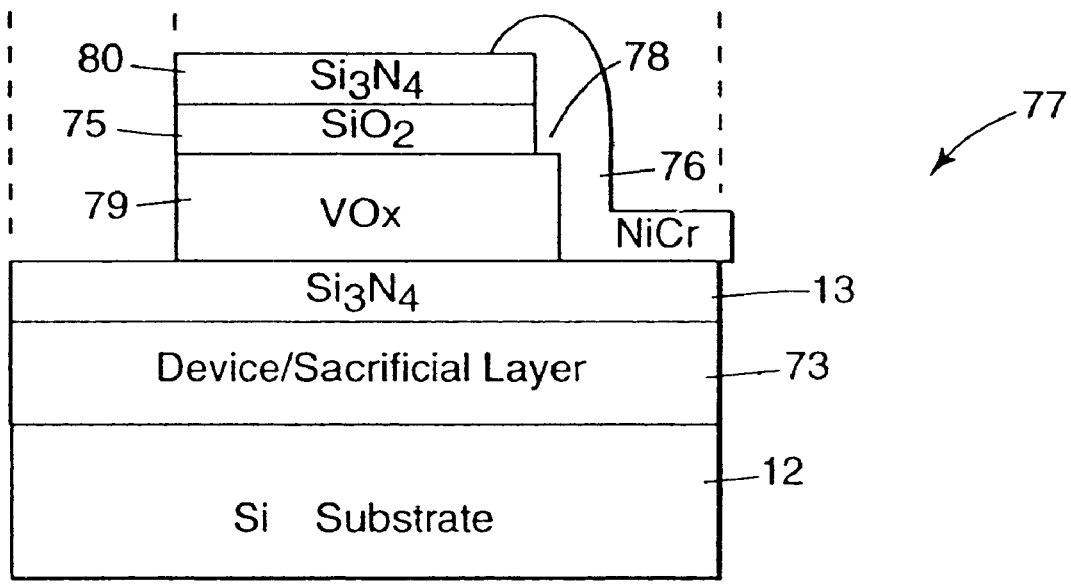

Silicon wafers 11 may be anything with active electronics thereon, such as CMOS or bipolar devices 73 of FIGS. 6a and 6b, or other kinds of detector components up to the Si3N4 layer 13, photoresist 74 and/or VOx layer 79 deposition. RGA 22 valve 28 is opened and argon flow is set to approximately 3 scc/m at stage 29 of process 18. RGA 22 is calibrated via an adjustment of its gain to get a standard RGA argon reading at step 30. RGA 22 is a closed source device. It is connected to chamber 27 in FIG. 4a. The output of RGA 22 detects a spectrum of species of gas constituents and the detected gases are identified. RGA 22 is pumped out so that the pressure in RGA 22 is lower than chamber 27, and the ion species have to go through a small orifice at valve 28. RGA 22 is made by UTI Inc. With RGA 22 valve open, the argon gas flow reading is set for calibrating RGA 22 to a known argon peak level.

At step 32, the argon gas flow is set for gun 33 and hollow cathode neutralizer (HCN) 34. Gun 33 uses argon as a sputtering gas. Ion beam 35 is neutralized by beam 40 of HCN 34. The ion gun is from Ion Tech Inc.

A target on target holder 36 is positioned relative to gun 33 beam 35 so that vanadium is selected as a target material 46. The other side of target holder has SiO2 as a selectable target material 47. The target material is set at a 45 to 55 degree angle relative to the direction of beam 35. The center of the target material is at a distance of 7 and ⅝ inches from the beam 35 exit of gun 33. Argon gas flow to gun 33 is set with MFC 37 to a 2.5 scc/m operating level, and to HCN 34 set with MFC 39 to a 3.5 scc/m operating level. Xenon (Xe) may also be used in place of Argon (Ar). Cooling water from source 41 is turned on to gun 33 via line 42 and to target holder 36 via line 43. At step 38, an ion gun power supply 44 is turned on and the initial gun start-up parameters are set to 20 mA at 1 kV. The ion gun source is turned on and the source stabilizes. Beam 35 of ion gun 33 is turned on. The power supply voltages are adjusted. There is plasma in gun 33 and ion beam 35 is generated or accelerated through grids of gun 33.

At next step 48, target material 46 is pre-sputtered with no oxygen. Pre-heat system quartz lamps 45 are turned off if on. Target material 46 is pre-sputtered for 240 seconds at the low power of 20 mA at 1 kV. During the next 240 seconds, target 46 is presputtered at the medium power of 35 mA at 1.5 kV. Presputter continues for the next 120 seconds at the high power of 50 mA at 2 kV, which concludes system calibration stage 20. The presputter without oxygen is for cleaning target 46 for ten minutes or so.

The following stage 50 begins with step 49 of presputter with an oxygen ramp to condition target 46 to a desired RGA 22 level. The oxygen goes up by little steps and then to larger steps as one measures the oxygen within system 18. This is not cleaning target 46 but conditioning target 46 to the desired RGA 22 level. One increases the oxygen to get a character profile for film 79 based on past experience and RGA 22 is set at an arbitrary level called y. The beam 35 power is kept at 50 mA at 2 kV and controller 53 of MFC 51 sets the oxygen flow to chamber 27 via tube 52, to 0.5 scc/m for 90 seconds. Then the oxygen flow is increased by 0.1 scc/m for 90 seconds. The latter is repeated until the 32 AMU partial pressure increase is equal to or greater than ten times over the previous partial pressure. The operating level setpoint is based on the partial pressure rise of the previous step which is about midpoint of the last 32 AMU partial pressure increase. The precise location of the operating setpoint determines the resistance and TCR. The 32 AMU partial pressure setpoint is entered into controller 53, which determines the level of oxygen flow for VOx film 79 deposition. One increases the flow of oxygen in an incremental way until $O_2$ is at a point where the RGA outputs an $O_2$ signal. One measures the mass and monitors the RGA $O_2$. Ion gun 33 is run at a set level with a fixed voltage and current. Monitoring of RGA 22 of 32 AMU is done at controller 53 where the flow is adjusted to achieve the starting level. A computer processor 56 may be used at step 59 to monitor RGA 22 and adjust the oxygen flow via controller 53 to achieve starting condition or level.

At step 54, rotation of wafer-substrate 11 is started. A control loop is started with a presputter for 300 seconds at the setpoint of controller 53. A shutter 55 is opened at step 58 after system 10 has stabilized. A timer 57 is started with the time determined by a desired thickness, of which the deposition rate is approximately at 25 Angstroms per second. RGA 22 may be monitored and oxygen flow adjusted at step 60 during deposition step 61. The center of sputtered target 46 with its surface at 45 to 55 degrees relative to and 12 inches from the to-be-deposited surface of wafer 11, is aligned at one inch from the center of wafer 11. After the desired thickness is achieved, then shutter 55 is closed at step 62. Then carousel 19 is turned at step 63 for the next wafer 11 to be coated, the control loop starts with the presputter at step 49 of deposition stage 20, and goes through the same steps of the process for the previous wafer 11 deposition. After all the substrates 11 of carousel are deposited, the control loop of stage 20 is stopped. The oxygen MFC 51 is set to zero scc/m, RGA 22 sample valve 28 is closed, ion beam 35 is turned off or to stand-by mode, and RGA 22 is turned off.

Process 18 is a low temperature process which does not go over 100 degrees C. which would cause photoresist 74 to harden. Typically this process is performed at about 80 degrees C. or less.

Process 18 for wafers 11 moves on to stage 64 for SiO2 deposition. At step 65, target holder 36 is rotated so that the surface of target 47 will be at a 45 degree angle relative to the direction at the center of ion beam 35 when it is turned on, and the oxygen flow is set to 2.0 scc/m at MFC 51. First wafer 11 is rotated in by carousel 19 as step 66. Ion gun 33 is turned on at 50 mA at 2 kV to presputter target 47 for 300 seconds. Shutter 55 is opened and timer 57 is started. Timer 57 is set to a time period to attain a desired thickness of SiO2 on wafer 11 at a deposition rate of 0.33 Angstrom per second at step 67. Then shutter 55 is closed. Next wafer 11 is rotated to by carousel 19 for SiO2 deposition at step 68, and steps for depositing SiO2 on previous wafer 11 are followed. After the last wafer 11 is coated with deposition of SiO2, the system 10 is shut down at step 69 of stage 64. Ion beam 35 is turned off, MFC 51 is set to 0.0 scc/m, ion beam source 33 is turned off, and substrate rotator 70 and carousel 19 are turned off. The one should wait and let system 10 cool down for 45 minutes. After cool-down, Hivac valve 24 is closed, and system 10 is vented with dry N2 from supply 71 through valve 72. One may open system 10 when it is at atmospheric pressure and remove wafers 11. To start process 18 over with another set of substrates or wafers 11, one introduces wafers 11 into upper chamber 31 through port 15 and close system 10. Quartz lamps 45 are turned on to a preset level to yield 80 degree C. temperatures in system 10. N2 vent gas valve 72 is turned off and MFC 37 and MFC 39 are set to 0.0 scc/m. Next pump down with cyropump 23 and open Hivac valve 24. Check for leaks and go through process 18 as indicated above. The values of the parameters and settings of the above-noted embodiments are by example only, but could vary from case to case.

From wafer 11, processed by system 10, is made microbolometer pixels 77 of FIGS. 6a and 6b. On wafer 11, prior to system 10 depositions of VOx and SiO2, may be Si substrate 12 covered with a device layer 73. On layer 73 is pixel Si3N4 material layer 13. Pixels 77 are defined with a photoresist mask 74. Then, VOx layer 79 and SiO2 layer 75 are respectively deposited on wafer 11 as indicated above and revealed in FIG. 6a. The next step is to chemically remove photoresist 74, and a portion of layers 79 and 75 formed on and over photoresist layer is likewise removed, resulting in pixel 77 as shown in FIG. 6b. A via or hole 78 is etched through layer 75 for electrical contact which is made with a nichrome (NiCr) strip 76 formed by depositing and patterning on a small portion of pixel 77. NiCr 76 forms the contact to the VOx portion of pixel 77. VOx layer 79 covers a major portion of pixel 77. An additional Si3N4 layer may be formed on pixel 77 of FIG. 6b for more protection. Layer 75 is about 200 Angstroms. If layer 75 were not put on prior to placement of contact 76, then the VOx portion of the pixel would be degraded due to the electrical degradation of VOx during presputter of the film prior to Si3N4 and subsequent NiCr deposition of strip 76. Layer 79 may range from 200–2000 Angstroms depending on the desired TCR. Layer 13 is about 500 Angstroms. But if an Si3N4 layer 80 is formed on layer 75, then NiCr strip would go through layer 80 and layer 75 to contact VOx layer 79.

We claim:

1. A VOx material comprising vanadium and oxygen forming respective portions of the VOx material, wherein x is a value selected to determine a thermal coefficient of resistance (TCR) of between $0.005°$ $C.^{-1}$ and $0.05°$ $C^{-1}$.

2. The VOx material of claim 1, wherein the relationship between VOx material resistance and TCR is provided by the relationship TCR=A+B*log(rho), where A and B are numerical constants.

3. The VOx material of claim 2, wherein:

A is between 0.005 and 0.05; and

B is between 0.1 and 0.001.

4. A VOx material comprising vanadium and oxygen, the material having a thermal coefficient of resistance (TCR) of between 0.005 and $0.05°$ $C.^{-1}$ and a log of conductivity between zero and three.

5. The VOx material of claim 4, wherein the TCR is between 0.005 and $0.03°$ $C.^{-1}$.

6. The VOx material of claim 4, the material further having a resistivity (rho), wherein the relationship between TCR and resistivity (rho) is generally defined by the equation TCR=A+B*log(rho), where A and B are numerical constants.

7. The VOx material of claim 6, wherein:

A is between 0.005 and 0.05; and

B is between 0.001 and 0.1.

* * * * *